(12) United States Patent  
Juengling

(10) Patent No.: US 7,800,965 B2  
(45) Date of Patent: Sep. 21, 2010

(54) DIGIT LINE EQUILIBRATION USING ACCESS DEVICES AT THE EDGE OF SUB-ARRAYS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 12/045,353

(22) Filed: Mar. 10, 2008

(65) Prior Publication Data

US 2009/0225612 A1    Sep. 10, 2009

(51) Int. Cl.  
*G11C 7/00*    (2006.01)

(52) U.S. Cl. .................................. 365/202; 365/203

(58) Field of Classification Search .................. None  
See application file for complete search history.

(56) References Cited

U.S. PATENT DOCUMENTS

| | | | |
|---|---|---|---|
| 5,844,833 A | 12/1998 | Zager et al. |
| 5,862,089 A | 1/1999 | Raad et al. |
| 5,903,502 A | 5/1999 | Porter |
| 5,936,874 A | 8/1999 | Clampitt et al. |
| 5,986,946 A | 11/1999 | Shirley et al. |
| 6,108,251 A | 8/2000 | Manning |
| 6,272,054 B1 | 8/2001 | Barh, Jr. et al. |
| 6,344,990 B1 | 2/2002 | Matsumiya et al. |
| 6,400,596 B2 | 6/2002 | Takemura et al. |
| 6,403,430 B1 | 6/2002 | Clampitt |
| 6,438,049 B1 | 8/2002 | Porter |
| 6,455,367 B2 | 9/2002 | Clampitt et al. |
| 6,480,407 B1 | 11/2002 | Keeth |
| 6,482,731 B1 | 11/2002 | Juengling |
| 6,535,439 B2 | 3/2003 | Cowles |
| 6,590,819 B1 | 7/2003 | Baum et al. |
| 6,635,917 B2 | 10/2003 | Juengling |
| 6,650,584 B2 | 11/2003 | Cowles |
| 6,678,199 B1 | 1/2004 | Joo |
| 6,714,434 B2 | 3/2004 | Morgan |
| 6,746,917 B2 | 6/2004 | Juengling |
| 6,753,220 B2 | 6/2004 | Juengling |
| 6,785,176 B2 * | 8/2004 | Demone ..................... 365/202 |
| 6,844,594 B2 | 1/2005 | Juengling |
| 6,882,557 B2 | 4/2005 | Kajigaya et al. |
| 6,936,899 B2 | 8/2005 | Juengling |
| 6,949,430 B2 | 9/2005 | Juengling |
| 7,009,250 B1 | 3/2006 | Mouli |
| 7,022,825 B2 | 4/2006 | Ashley et al. |

(Continued)

OTHER PUBLICATIONS

International Search Report for International Application No. PCT/US2009/036563, dated Oct. 13, 2009, three (3) pages.

(Continued)

*Primary Examiner*—Hoai V Ho  
*Assistant Examiner*—James G Norman  
(74) *Attorney, Agent, or Firm*—TraskBritt

(57) ABSTRACT

A method of equilibrating digit lines, a memory array, device, system and wafer for digit lines configured in an open digit line architecture. The digit lines are equilibrated by coupling a terminated end of a first digit line to an equilibration reference and coupling an unterminated end of a second digit line to the terminated end of the first digit line. The memory array is configured with the first and second digit lines arranged directly adjacent to each other.

26 Claims, 10 Drawing Sheets

U.S. PATENT DOCUMENTS

| | | |
|---|---|---|
| 7,038,958 B2 | 5/2006 | Joo et al. |
| 7,098,105 B2 | 8/2006 | Juengling |
| 7,110,319 B2 | 9/2006 | Kim et al. |
| 7,476,933 B2 | 1/2009 | Juengling |
| 7,573,108 B2 | 8/2009 | Juengling |
| 2003/0002370 A1 | 1/2003 | Cowles |
| 2003/0030150 A1* | 2/2003 | Keeth .......... 257/776 |
| 2003/0043645 A1 | 3/2003 | Pinney |
| 2006/0102977 A1 | 5/2006 | Fucsko et al. |
| 2006/0198220 A1 | 9/2006 | Yoon et al. |
| 2006/0268638 A1* | 11/2006 | Yoon et al. .......... 365/205 |
| 2006/0289914 A1 | 12/2006 | Juengling |
| 2007/0091686 A1 | 4/2007 | Won |

OTHER PUBLICATIONS

Written Opinion of the International Searching Authority (ISA/KR) for International Application No. PCT/US2009/036563, dated Oct. 13, 2009, five (5) pages.

* cited by examiner

DIGIT LINE EQUILIBRATION USING ACCESS DEVICES AT THE EDGE OF SUB-ARRAYS

FIELD OF THE INVENTION

Various embodiments of the present invention relate generally to the field of volatile memory devices and, more particularly, to equilibrating digit lines of a random access memory.

BACKGROUND OF THE INVENTION

A memory device such as a dynamic random access memory (DRAM) device conventionally comprises a number of memory cells arranged in rows and columns. The memory cells are grouped into sub-arrays. Each memory cell includes a capacitor capable of holding a charge and an access transistor for accessing the capacitor charge. The charge is referred to as a data bit and can be either a high voltage or a low voltage. Data can be either stored in the memory cells during a write mode, or data may be retrieved from the memory cells during a read mode. The access transistors of the memory cells connect to internal signal lines, referred to as bit or digit lines. The digit lines connect to input/output lines through input/output transistors, which are used as switching devices to allow data to be transmitted between the digit lines and the input/output lines during a read or write mode.

A number of sense amplifiers are included in the memories to both sense data stored in the memory cells and amplify the data for outputting. Each sense amplifier compares a charge stored on a memory cell with a known reference. A sense amplifier conventionally connects to two digit lines to perform the sensing operation. In the sensing operation, the two digit lines are first equalized using an equilibrate circuit to a reference voltage which is typically, but not limited to, one half of the supply voltage (Vcc) also sometimes referred to as DVC2. After that, the digit lines are driven to opposite voltage levels. That is, one of the digit lines is driven to Vcc and the other is driven to ground. The voltage on the digit line connected to the memory cell being accessed indicates the value of data stored in the memory cell.

In an open digit line memory device, all digit lines are interleaved. Specifically, due to the relatively larger dimensions of a sense amplifier compared with the dimensions of a memory cell, one digit line of a sub-array connects to one sense amplifier on one side of the sub-array, and an adjacent digit line connects to another sense amplifier on the other side of the sub-array. Therefore, a digit line has a terminated end that directly couples to the sense amplifier through which the logic states are programmed or sensed and an extended or unterminated end that has the highest impedance path to that sense amplifier.

Since the sensing circuitry on each side of the sub-array only accesses every other, or alternating, digit lines, the sense amplifiers may be implemented on the edge of the sub-array according to double the spacing, or pitch, of the digit lines. The physical space required to implement the sense amplifiers typically limits the density of the memory cells in the sub-array. Accordingly, the open digit line architecture with interleaved digit lines facilitates small digit line pitch sizes since the sense amplifiers are implemented on alternating sides of the memory sub-array. Furthermore, small digit line pitch sizes allow for high density sub-arrays which result in a large quantity of attached memory cells and a relatively large physical length of the digit line through the sub-array.

In order to prepare digit lines for sensing logic values from the memory cells, equilibrate circuits have been formed to electrically balance the digit lines. Conventional equilibrate circuits have been designed as part of the sense amplifier and have been designed according to larger feature sizes associated with the sense amplifiers. These larger feature sizes of the equilibrate circuit are undesirable in view of attempts to further reduce the size of a memory array and the associated circuitry.

For the reasons stated above, and for other reasons stated below which will become apparent to those skilled in the art upon reading and understanding the present specification, there is a need in the art for an improved equilibrate circuit that does not affect the pitch of the interleaved digit lines.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be implemented, and that structural, logical and electrical changes may be made without departing from the spirit and scope of the present invention.

A method of equilibrating digit lines, a memory array, device, system and wafer including the same are disclosed. In one embodiment of the present invention, digit lines in a memory device are equilibrated by coupling a terminated end of a first digit line to an equilibration reference and at least partially concurrently therewith, an unterminated end of a second digit line is coupled to the terminated end of the first digit line. The memory array is configured in an open digit line arrangement with the first and second digit lines arranged directly adjacent to each other.

Figure 1:
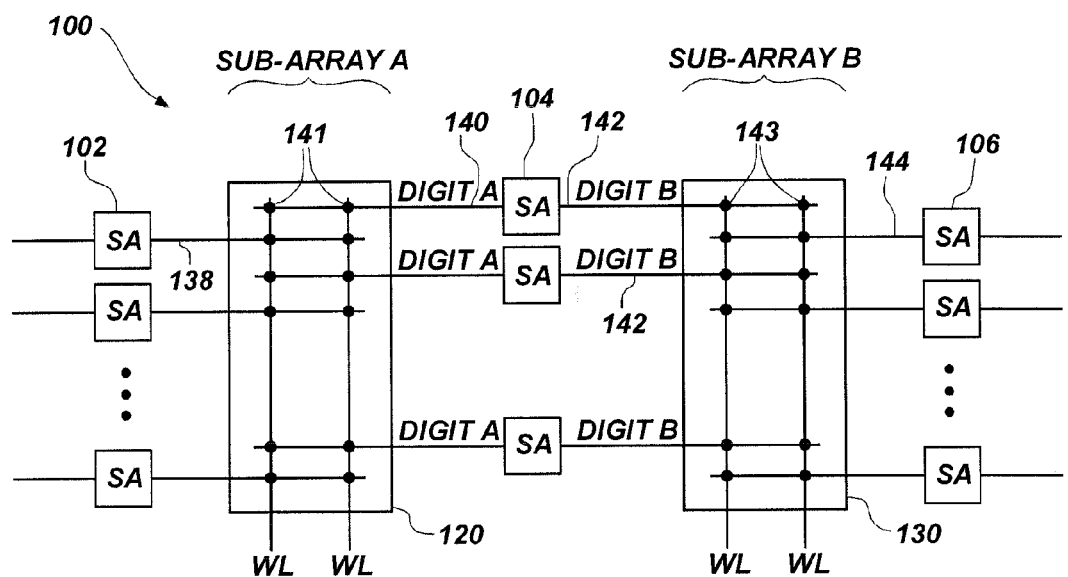
FIG. 1 is a block diagram of a portion of an open digit line architecture of a memory device including a plurality of memory sub-arrays, in accordance with various embodiments of the present invention.

FIG. 1 is a diagram of a portion of a memory array 100 in accordance with various embodiments of the invention. Memory array 100 includes a plurality of sub-arrays including sub-array A 120 and sub-array B 130, a plurality of sense amplifiers (SA) 102, 104, 106 and the memory array is configured according to an open digit line architecture. By way of illustration, a memory cell is located at each row and column intersection with the memory cells in the same column connected to the same digit line, DIGIT A or DIGIT B. The memory cells in the same row connect to the same row line or word line, WL. That is, the digit lines are interleaved, such that an activated word line WL will access a memory cell on each digit line.

Each of the sense amplifiers 104 connects to a first digit line 140, e.g., DIGIT A, on one side and a second digit line 142, e.g., DIGIT B on the opposite side. First digit line A 140 connects to a plurality of memory cells 141, indicated by dots at each intersection of a digit line and a word line, WL, in sub-array A 120. Second digit line B 142 also connects to a plurality of memory cells 143 in sub-array B 130 which are similar to those in sub-array A 120. Digit lines A 140 are interleaved with digit lines 138 in sub-array A 120 and digit lines B 142 are interleaved with digit lines 144 in sub-array B 130.

In another embodiment of the present invention, a memory array is disclosed and includes a memory sub-array configured in an open digit line architecture. The memory array further includes an equilibrate circuit configured to equilibrate a plurality of digit lines in the memory sub-array. Furthermore, the equilibrate circuit includes pass transistors configured at less than the digit line pitch.

Figure 2:
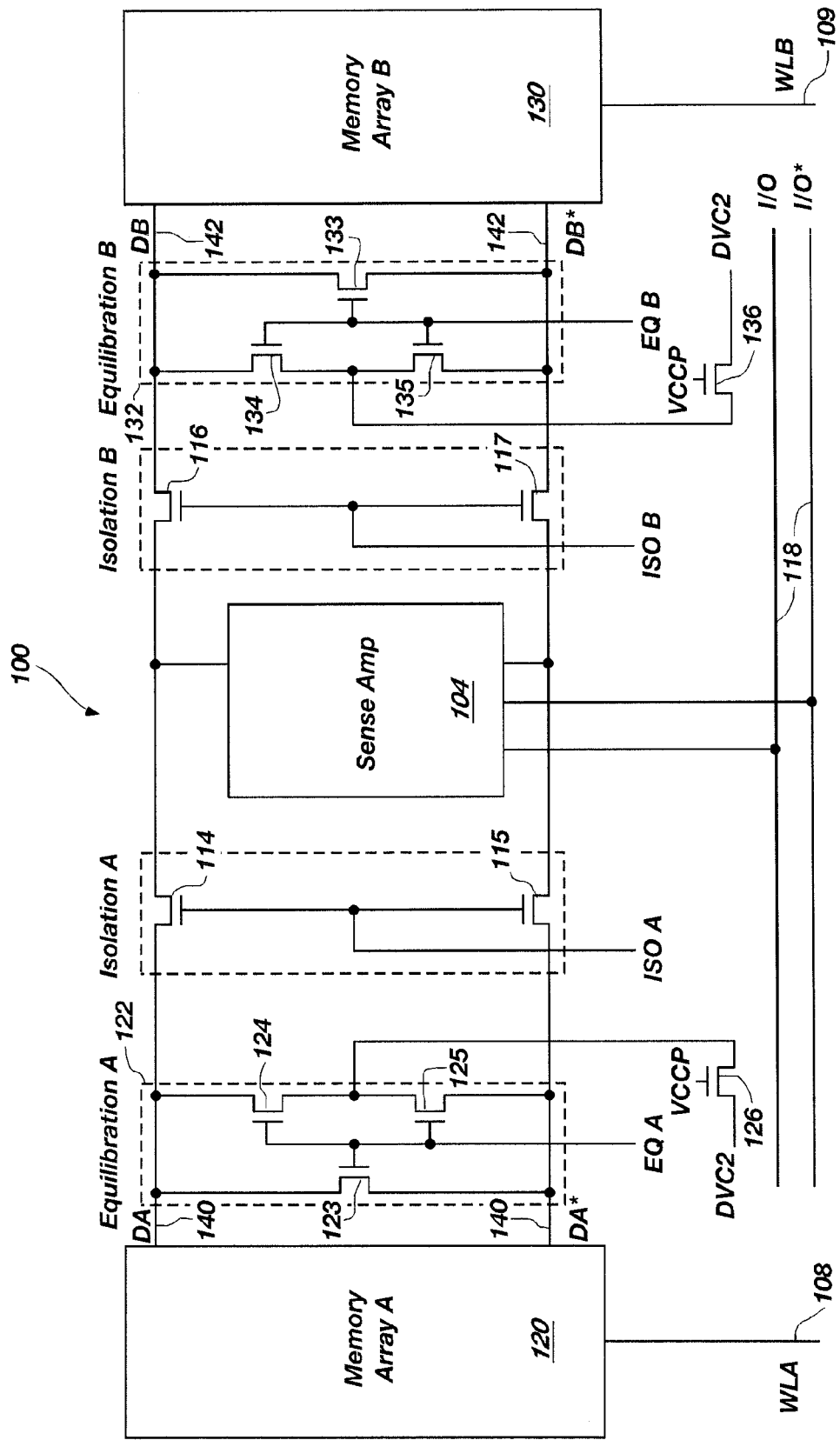
FIG. 2 illustrates equilibrate and isolation circuitry, in accordance with various embodiments of the present invention.

FIG. 2 illustrates equilibrate and isolation circuitry for coupling a memory sub-array with a sense amplifier, in accordance with various embodiments of the present invention. The sense amplifier 104 may sense a first memory sub-array A 120 and a second memory sub-array B 130, each of which contains a plurality of memory cells. The sense amplifier 104 senses the voltage level in a selected memory cell of the selected sub-array A 120 or sub-array B 130, via the pair of complementary digit lines 140 or a selected memory cell of the selected sub-array B 130, via the pair of complementary digit lines 142, respectively. One of sub-array A 120 or sub-array B 130 is selected by the application of a signal to a word line 108 or 109 corresponding to a memory cell in memory sub-array A 120 or memory sub-array B 130, respectively and the application of a signal to ISOA and ISOB to transistors 114, 115 and 116, 117, respectively. Thus, when ISOA is enabled and driven to a logic high value, transistors 114 and 115 become conductive, i.e., turn on, to connect sub-array A 120 to sense amplifier 104. When ISOB is enabled and driven to a logic high value, transistors 116 and 117 turn on to connect sub-array B 130 to sense amplifier 104.

Equilibrate circuits 122 and 132 are provided to pre-charge the digit lines. For simplicity, the operation of equilibrate circuit 122 for the memory sub-array A 120 side of the sense amplifier 104 is now described, it being understood that equilibrate circuit 132 operates the same way for the memory sub-array B 130 side of the sense amplifier 104, including transistors 133-136.

Equilibrate circuit 122 includes transistor 123 with a first source/drain region coupled to digit line 140, a second source/drain region coupled to the complementary digit line 140 and a gate coupled to receive an equilibration signal labeled EQA. Equilibrate circuit 122 further includes transistors 124, 125 and 126. Transistor 124 includes a first source/drain region that is coupled to digit line 140, a gate that is coupled to receive the equilibration signal EQA, and a second source/drain region that is coupled to a first source/drain region of transistor 126. Transistor 125 includes a first source/drain region that is coupled to complementary digit line 140, a gate that is coupled to receive the equilibration signal EQA, and a second source/drain region that is coupled to the first source/drain region of transistor 126. Transistor 126 has a second source/drain region that is coupled to an equilibration voltage DVC2, typically Vcc/2, and a gate that is connected to a pumped Vcc voltage, VCCP, which is typically about one to two volts higher than Vcc. The application of VCCP to the gate of transistor 126 causes transistor 126 to supply equilibrated voltage to transistor 124, 125. When the EQA signal is at a high logic level, transistors 124, 125 apply the equilibrated voltage to the digit lines 140, and transistor 123 shorts the lines such that both lines are equilibrated to the voltage Vcc/2 also referred to as DVC2.

During a read operation, the digit line 140 will go to Vcc or GND depending on the stored charge in the read memory cell. The sense amplifier 104 senses the differential voltage across the digit lines 140, which represents the charge stored in the accessed memory cell, and drives the one of the digit lines 140 containing the higher voltage to Vcc and the other one of the digit lines 140 containing the lower voltage to GND. These respective voltages, Vcc and GND, are also provided to the I/O, I/O* lines 118.

According to sense amplifier layouts known in the art, equilibrate circuits for respective sense amplifiers are conventionally positioned within the sense amplifier circuit blocks of the memory device layout. In such a configuration, the equilibrate transistors 123, 124, 125 are fabricated using larger feature sizes of the sense amplifiers resulting in a much larger circuit area. However, according to the various embodiments of the present invention, the equilibrate circuits for the sense amplifiers are not located within the sense amplifier blocks, but instead are located within or as an extension to the memory sub-array blocks. Specifically, the various embodiments of the present invention form the equilibrate circuit after the last memory cell along the word line at the edge of the memory sub-array. Furthermore, the various embodiments of the present invention enable the equilibrate circuit to be formed according to the generally smaller layout dimensions of the memory sub-array which is in contrast to the prior art equilibrate circuits formed in or near the sense amplifiers according to the layout dimensions and rules of the devices associated with the sense amplifiers. Forming equilibrate circuits according to sense amplifier design guidelines results in an unnecessarily bulky design and places the equilibrate circuit yet further away from the portion of the digit line that passes through the memory sub-array.

Figure 3:
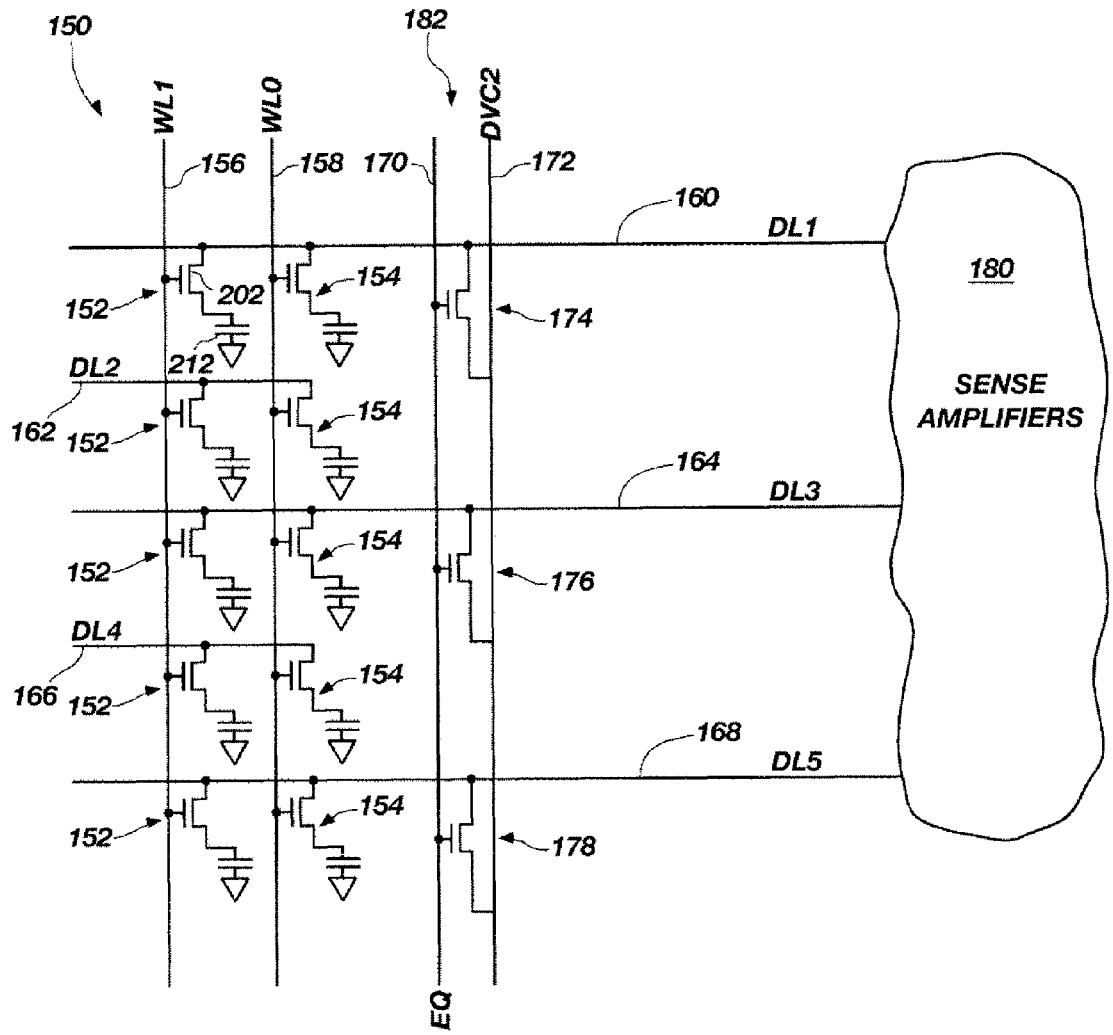
FIG. 3 illustrates an equilibrate circuit for a portion of a memory sub-array, in accordance with various embodiments of the present invention.

FIG. 3 illustrates a circuit diagram of an equilibrate circuit in a portion of a memory sub-array, in accordance with an embodiment of the present invention. A portion of a memory sub-array 150 is illustrated in an open-digit line architecture that includes interleaved digit lines. In FIG. 3, a plurality of memory cells 152 are arrayed along word line WL1 156 and a plurality of memory cells 154 are further arrayed along word line WL0 158. Digit lines DL1-DL5 160-168, respectively, are interleaved through the memory sub-array. Specifically, memory cells 154 are the initial memory cells along digit line DL1 160, digit line DL3 164 and digit line DL5 168 that connect to the sense amplifiers 180. Memory cells 154 represent the last or terminal memory cells along digit line DL2 162 and digit line DL4 166 that connect to sense amplifiers (not shown) located on the opposite side of the memory sub-array.

As stated, prior to a read operation of the memory sub-array, the digit lines DL1-DL5 160-168 must be equilibrated to remove undesirable electrical charge from the digit lines prior to sensing the logic state of the memory cells in the sub-array of the memory device. The present embodiment utilizes an equilibrate circuit formed at the edge of the memory sub-array according to the layout criteria and processes of the sub-array as opposed to the layout criteria of the sense amplifier. Accordingly, an equilibrate circuit 182 includes equilibration pass transistor 174 formed at the edge of the memory sub-array 150 formed as part of the memory sub-array. By way of illustration, equilibration pass transistor 174 connects the digit line DL1 160 to the equilibration reference 172 (DVC2) when activated by an equilibrate signal 170. FIG. 3 further illustrates pass transistor 176 similarly connected for equilibrating digit line DL3 164 and pass transistor 178 for equilibrating digit line DL5 168. It should be noted that since the memory sub-array is configured according to an open digit line architecture, digit line DL2 162 and digit line DL4 166 are equilibrated by another portion of the equilibrate circuit (not shown) similarly configured on the opposite side of the memory sub-array.

Figure 4:
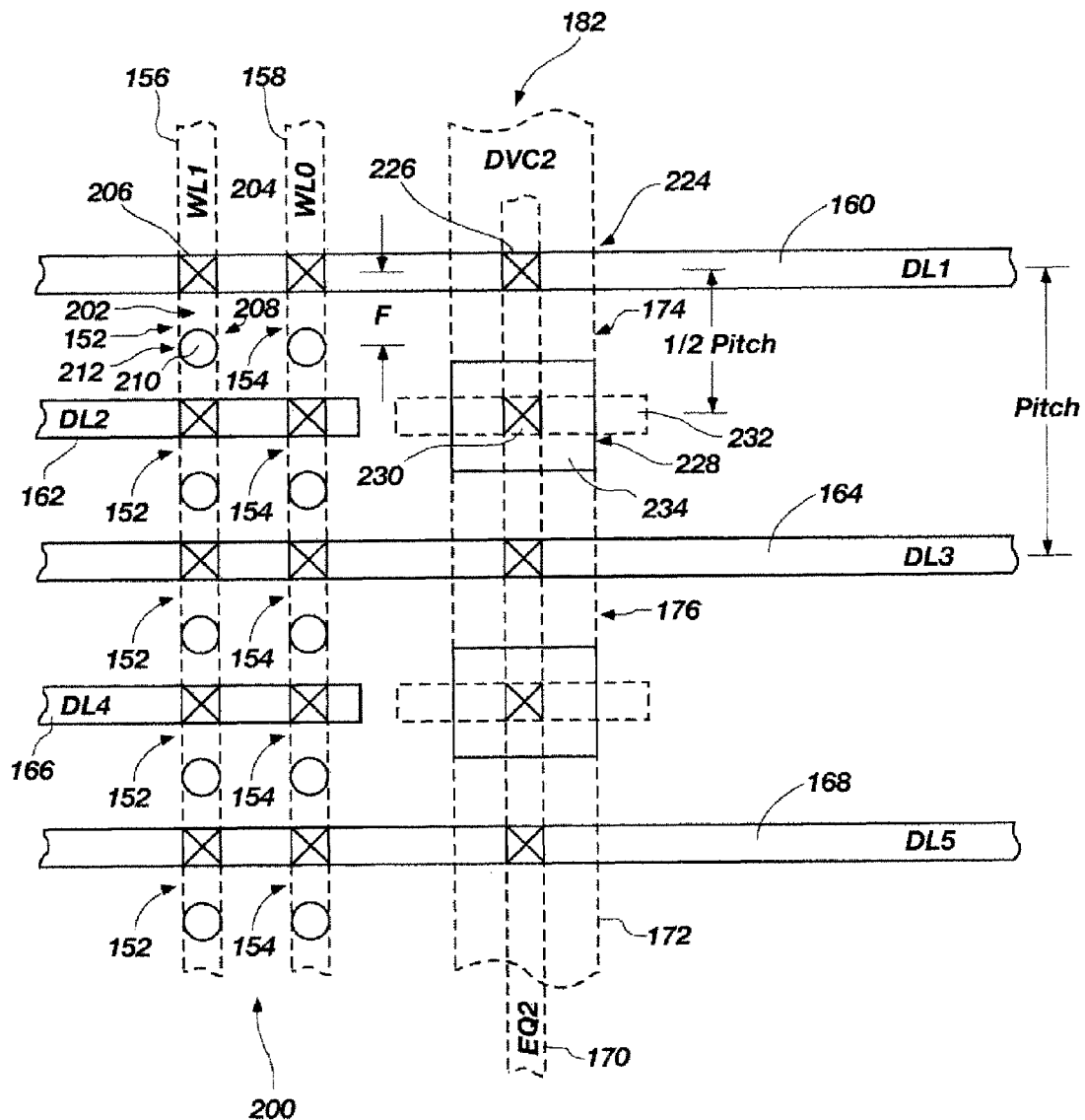
FIG. 4 illustrates a physical layout of the equilibrate circuit of FIG. 3, in accordance with various embodiments of the present invention.

FIG. 4 illustrates a physical layout of an edge of a sub-array of memory cells of the circuit illustrated in FIG. 3, according to one or more embodiments of the present invention. The present invention departs from conventional DRAM layouts known in the art by relocating equilibrate circuits within the array and adjacent the last row of memory cells 154 at the edge of memory cell sub-array 150. The equilibrate signal 170 for the equilibration transistors is adjacent the word lines WL of the memory sub-array and the equilibrate signal 170 is configured to be formed according to the process steps and dimensions of the next adjacent word line WL. Furthermore, the physical layout of FIG. 4 illustrates digit line DL1 160 and digit line DL3 164 being separated by a single digit line pitch.

As shown in FIG. 4, block 200 of memory cells 152, 154 is formed in a substrate according to one or more known methods, nonlimiting examples of which are disclosed in U.S. patent application Ser. No. 11/366,212, filed Mar. 2, 2006, issued as U.S. Pat. No. 7,476,933 on Jan. 13, 2009 and titled "Vertical Gated Access Transistor" assigned to the assignee of the present application, and U.S. patent application Ser. No. 11/433,533, filed May 12, 2006, issued as U.S. Pat. No. 7,573,108 on Aug. 11, 2009 and titled "Non-Planar Transistor and Techniques for Fabricating the Same," assigned to the assignee of the present application, the disclosures of which are herein incorporated by reference in their entirety. By way of example and not limitation, a single memory cell and corresponding portion of an equilibrate circuit is described with a similar configuration for each memory cell and each digit line. As stated, the memory sub-array is configured in an open digit line architecture where the digit lines are interleaved. Therefore, while a portion of the equilibrate circuit is illustrated for one edge of the memory sub-array, a symmetric portion would also be implemented on the opposite edge (not shown) of the memory sub-array for equilibrating the other portion of the interleaved digit lines.

As illustrated, a memory cell 152 includes a pass transistor 202 formed between a vertical pillar 204 configured for coupling by way of a contact 206 (denoted by an "X") to digit line DL1 160. The pass transistor 202 is further formed to include another vertical pillar 208 configured for coupling via a contact 210 (denoted by a "O" to a capacitor 212). The pass transistor 202 is controlled by word line WL1 156 which, when activated, connects the capacitor 212 (FIG. 3) to the digit line DL1 160.

As stated, digit lines must be equilibrated to a neutral reference that is not biased to favor the reading of one logic state over another logic state. The equilibrate circuit 182 is responsive to an equilibrate signal 170 for activating equilibration pass transistors 174, 176. According to the embodiment illustrated with reference to FIGS. 3 and 4, the equilibration pass transistor 174 is configured as a vertically gated pass transistor formed at half the digit line pitch (width of the feature plus the space to the next repeated feature) of the memory sub-array. As stated, conventional equilibrate circuits have been formed according to the design parameters of the sense amplifiers which are designed at much larger dimensions than the half pitch equilibration pass transistors of the equilibrate circuit of the various embodiments of the present invention.

The equilibration pass transistor 174 is also formed according to the processes of formation of the pass transistor of the memory cell, however, the equilibration pass transistor 174 is formed as a long transistor to maintain similar processing steps as are performed during the manufacturing of the memory sub-array. The equilibration pass transistor 174 couples the digit line DL1 160 to an equilibration reference 172 (DCV2) when the equilibrate signal 170 is asserted. The equilibration pass transistor 174 is formed between a vertical pillar 224 configured for coupling by way of a contact 226 (denoted by an "X") to digit line DL1 160. The equilibration pass transistor 174 is further formed to include another vertical pillar 228 configured for coupling via a contact 230 (denoted by an "X") to an isolated portion 232 of the digit line layer for manufacturing simplicity. A subsequent contact 234 denoted by a larger "X" continues the contacting of the equilibration pass transistor 174 to the equilibration reference 172 (DCV2) when the equilibrate signal 170 is asserted.

Figure 5:
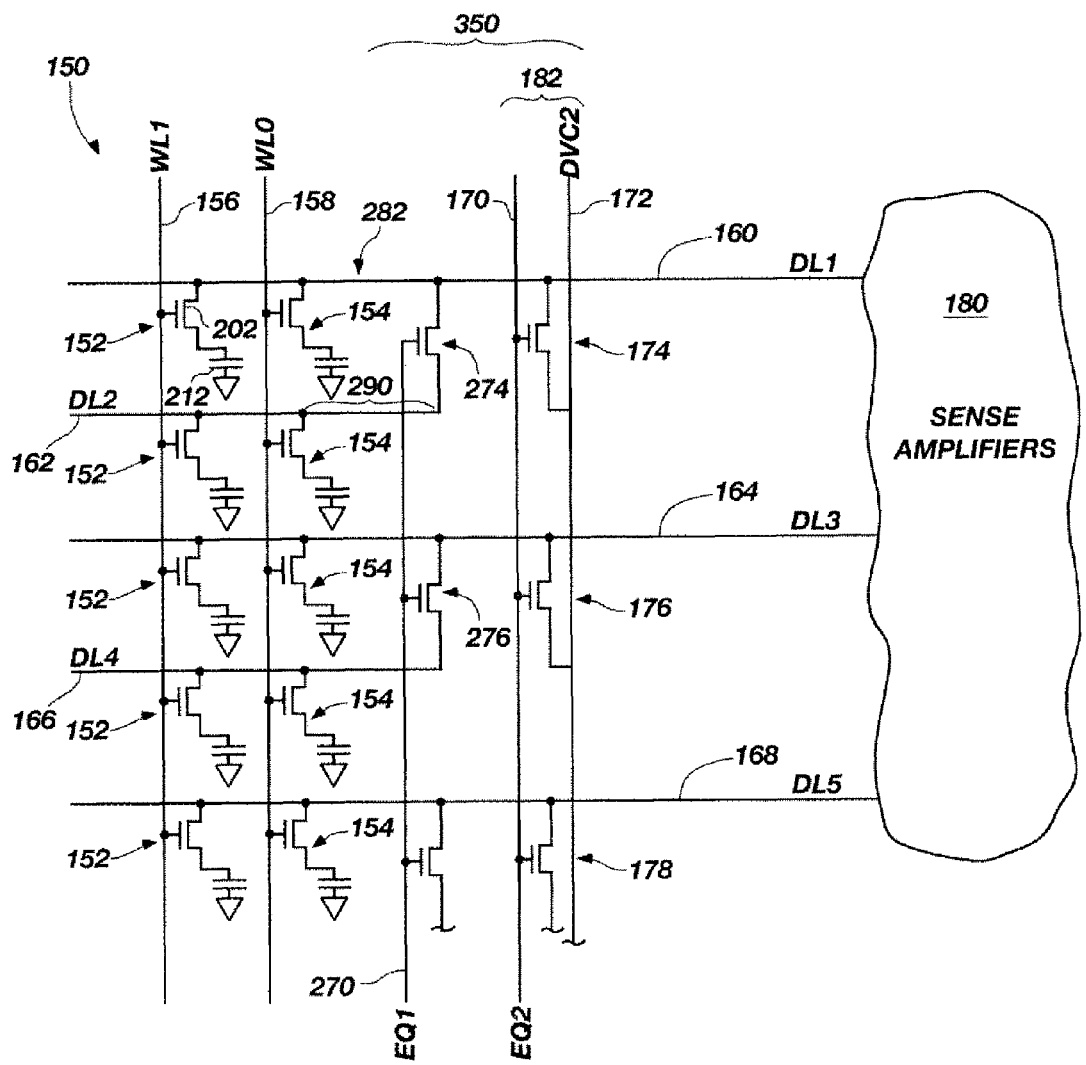
FIG. 5 illustrates another equilibrate circuit for a portion of a memory sub-array, in accordance with various embodiments of the present invention.

FIG. 5 illustrates a circuit diagram of an equilibrate circuit in a portion of a memory sub-array, in accordance with various other embodiments of the present invention. A portion of a memory sub-array 150 is illustrated in an open digit line architecture that includes interleaved digit lines. In the present embodiment, an equilibrate circuit is formed at the edge of the memory sub-array according to the layout criteria of the sub-array as opposed to the layout criteria of the sense amplifier. Accordingly, an equilibrate boosting circuit 282 includes an equilibrate boosting pass transistor 274 formed at the edge of the memory sub-array 150 and is further formed as part of the memory sub-array. By way of illustration, equilibrate boosting pass transistor 274 connects the digit line DL1 160 to the digit line DL2 162 when activated by the equilibrate boosting signal 270. In one embodiment, the equilibrate boosting signal 270 is activated to match the duty cycle of the equilibrate signal 170. In another embodiment of the present invention, the equilibrate boosting signal 270 is activated during a portion of the activation of equilibrate signal 170 to provide an equilibration boost to the equilibrate circuit 350 by reducing the resistance of the digit line during the equilibration process. To form the connection with digit line DL2 162, the digit line DL2 162 is formed to include an extended portion 290 of digit lines DL at their extended end opposite the digit line end connected to the sense amplifier.

The equilibrate boosting circuit 282 enhances equilibration speed by coupling the extended or unterminated end of the digit line during equilibration with an adjacent digit line very near an equilibrate circuit. The equilibrate boosting circuit 282 enables the charge on the digit line to be equilibrated from both ends of the digit line by connecting the extended or unterminated end of the digit line with an adjacent digit line that is physically near an equilibrate circuit. Equilibrating a digit line from both ends provides a lower resistance along the digit line as well as provides multiple current paths for charging or discharging the digit line. In one embodiment, the equilibrate circuit utilized by the equilibrate boosting circuit 282 is located within the sense amplifiers 180. In another embodiment, the equilibrate boosting circuit 282 utilizes an equilibrate circuit 182 as described with respect to FIGS. 3 and 4.

Figure 6:
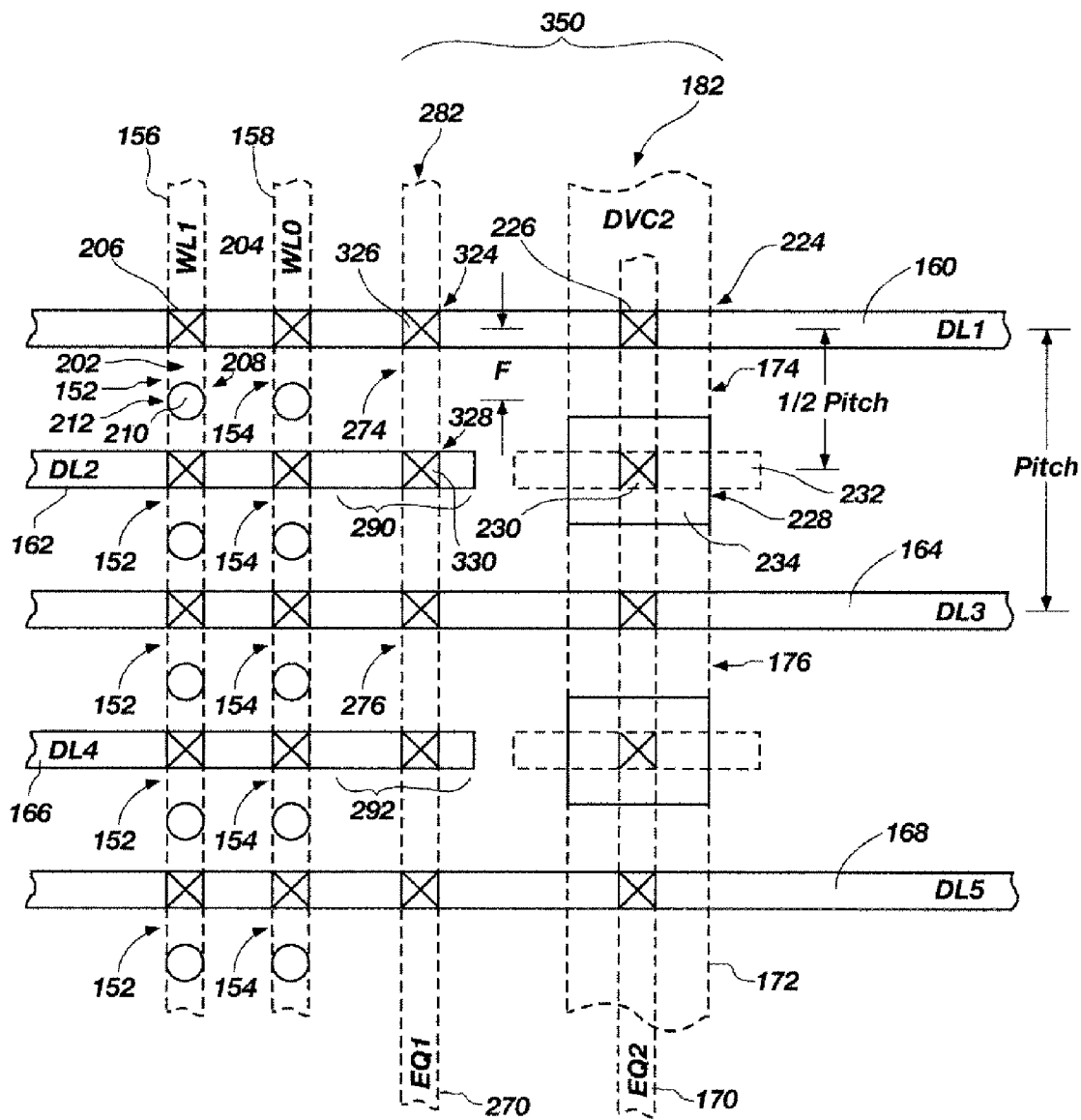
FIG. 6 illustrates a physical layout of the equilibrate circuit of FIG. 5, in accordance with various embodiments of the present invention.

FIG. 6 illustrates a physical layout of an edge of a sub-array of memory cells of the circuit illustrated in FIG. 5, according to one or more embodiments of the present invention. The equilibrate circuit 282 includes an equilibrate boosting signal 270 for activating equilibrate boosting pass transistors 274, 276. According to the embodiment illustrated with reference to FIG. 6, the equilibrate boosting pass transistor 274 is configured as a vertically gated pass transistor formed at half the digit line pitch (width of the feature plus the space to the next repeated feature) of the memory sub-array. As stated, conventional equilibrate circuits have been formed according to the design parameters of the sense amplifiers which are designed at much larger dimensions than the half pitch equilibration pass transistors of the equilibrate circuit of the various embodiments of the present invention.

The equilibrate boosting pass transistor 274 is also formed as a vertical transistor as are the memory cell pass transistors, however, the equilibration pass transistor is formed as a long transistor and maintains similar design dimensions as are used for the manufacturing of the memory sub-array. The equilibrate boosting pass transistor 274 couples the digit line DL1 160 to digit line DL2 162 when the equilibrate boosting signal 270 is asserted. The equilibrate boosting pass transistor 274 is formed between a vertical pillar 324 configured for coupling by way of a contact 326 (denoted by an "X") to digit line DL1 160. The equilibrate boosting pass transistor 274 is further formed to include another vertical pillar 328 configured for coupling via a contact 330 (denoted by an "X") to an extended portion 290 of the digit line DL2 162. Likewise, DL4 166 may include an extended portion 292.

As stated, the equilibrate circuit may be implemented as equilibrate circuit 182 rather than relying on an equilibrate circuit in the sense amplifier. Accordingly, in another embodiment, an equilibrate circuit 350 may include the combination of equilibrate circuit 182 and equilibrate boosting circuit 282.

Figure 7:
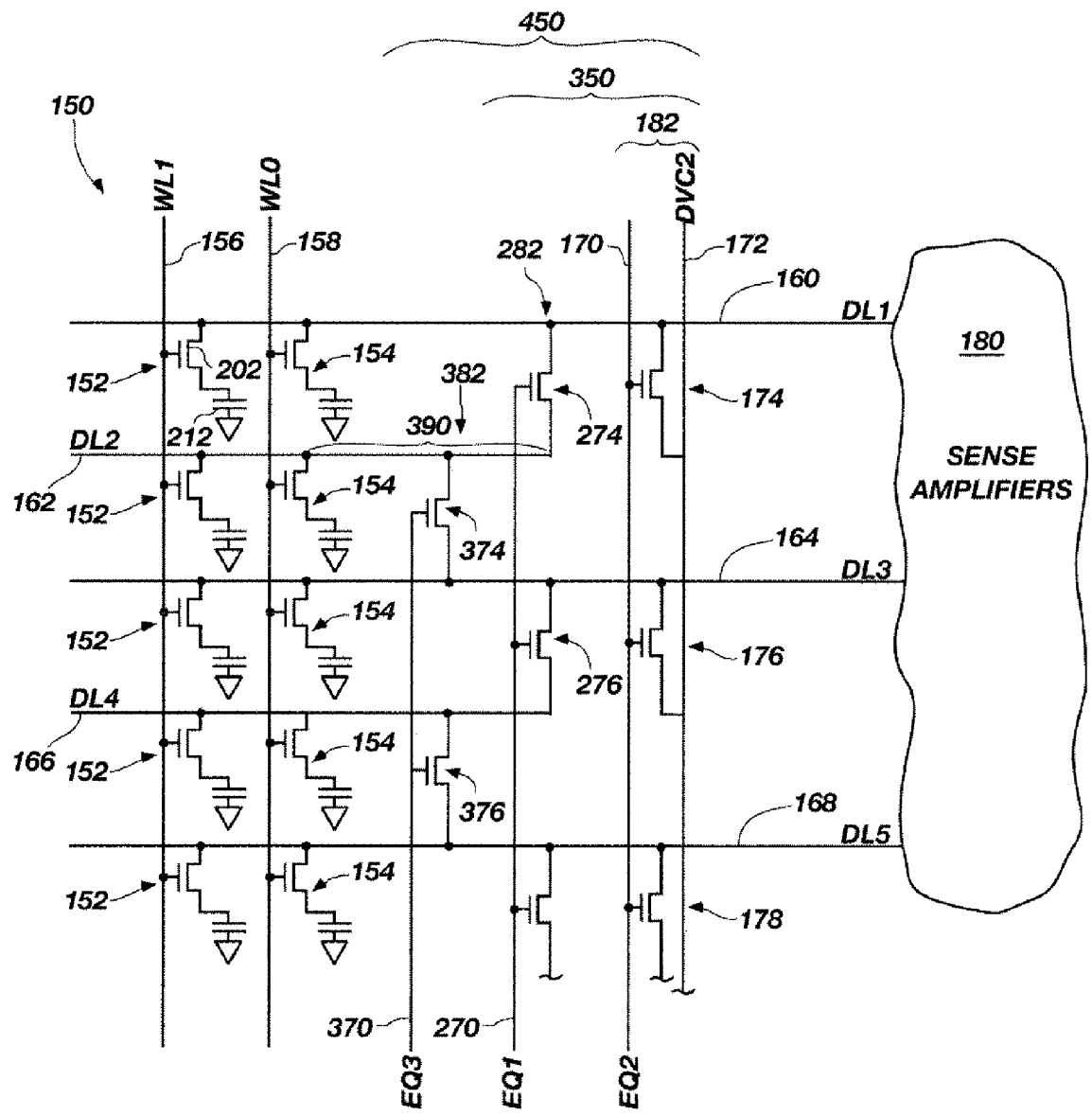
FIG. 7 illustrates yet another equilibrate circuit for a portion of a memory sub-array, in accordance with various embodiments of the present invention.

FIG. 7 illustrates a circuit diagram of an equilibrate circuit in a portion of a memory sub-array, in accordance with various other embodiments of the present invention. A portion of a memory sub-array 150 is illustrated and is implemented as described hereinabove. In one illustrated embodiment, an equilibrate circuit is formed at the edge of the memory sub-array according to the layout criteria of the sub-array as opposed to the layout criteria of the sense amplifier. Accordingly, an equilibrate circuit 450 includes equilibrate circuit 350 (FIGS. 5 and 6) and further includes a further equilibrate boosting circuit 382 including equilibrate boosting pass transistor 374 formed at the edge of the memory sub-array 150 and formed as a part of the memory sub-array. By way of illustration, equilibrate boosting pass transistor 374 connects the digit line DL2 162 to the digit line DL3 164 when activated by the equilibrate boosting signal 370. In one embodiment, the equilibrate boosting signal 370 is activated to match the duty cycle of the equilibrate signal 170 and equilibrate boosting signal 270. In another embodiment of the present invention, the equilibrate boosting signal 370 is activated during a portion of the activation of equilibrate signal 170 and equilibrate boosting signal 270 to provide an equilibration boost to the equilibrate circuit 450 by reducing the resistance of the digit line during the equilibration process. To form the connection with the extended end of digit line DL2 162, the digit line DL2 162 is formed to include an extended portion 390 of digit lines DL2 162 at its extended end. In the present embodiment, the further equilibrate boosting circuit 382 is offset by one digit line from the equilibrate boosting circuit 282. This offset of equilibrate boosting circuits enables the formation of a network of pass gates that essentially shorts all digit lines DL1-DL5 together resulting in a common equilibration reference voltage across all of the digit lines DL.

The equilibrate boosting circuit 382 enhances equilibration speed by coupling the extended or unterminated end of the digit line during equilibration with an adjacent digit line very near an equilibrate circuit. The equilibrate boosting circuit 382 enables the charge on the digit line to be equilibrated from both ends of the digit line by connecting the extended or unterminated end of the digit line with an adjacent digit line that is physically near an equilibrate circuit. Equilibrating a digit line from both ends provides a lower resistance along the digit line as well as provides multiple current paths for charging or discharging the digit line resulting in faster equilibration times. In one embodiment, the equilibrate circuit utilized by the equilibrate boosting circuit 382 is located within the sense amplifiers 180. In another embodiment, the equilibrate boosting circuit 382 utilizes an equilibrate circuit 182 at the edge of the memory sub-array as described with respect to FIGS. 3 and 4.

Figure 8:
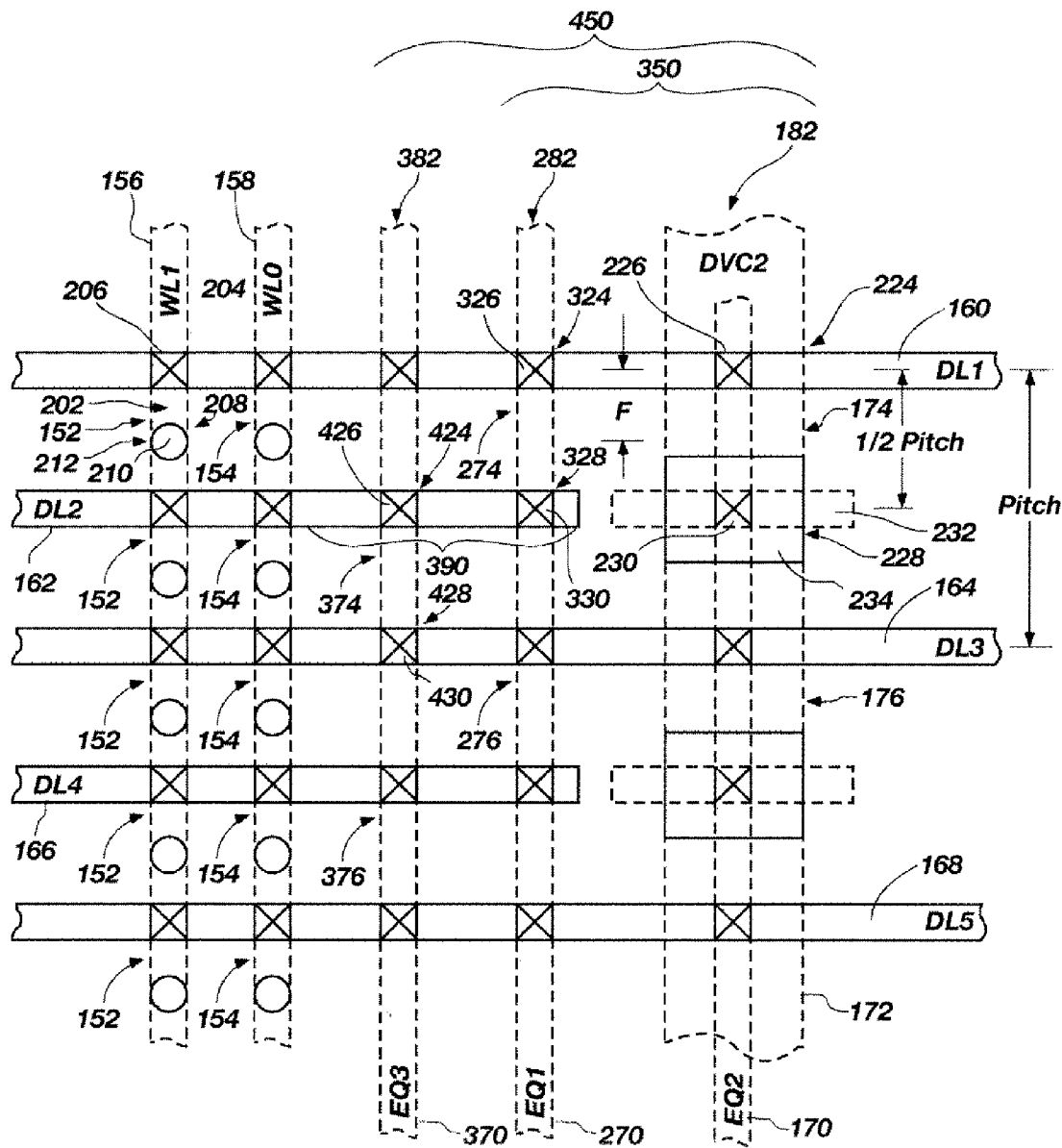
FIG. 8 illustrates a physical layout of the equilibrate circuit of FIG. 7, in accordance with various embodiments of the present invention.

FIG. 8 illustrates a physical layout of an edge of a sub-array of memory cells of the circuit illustrated in FIG. 7, according to one or more embodiments of the present invention. The equilibrate circuit 382 includes an equilibrate boosting signal 370 for activating equilibrate boosting pass transistors 374, 376. According to the embodiment illustrated with reference to FIG. 8, the equilibrate boosting pass transistor 374 is configured as a vertically gated pass transistor formed at half the digit line pitch (width of the feature plus the space to the next repeated feature) of the memory sub-array. As stated, conventional equilibrate circuits have been formed according to the design parameters of the sense amplifiers which are designed at much larger dimensions than the half pitch equilibration pass transistors of the equilibrate circuit of the various embodiments of the present invention.

The equilibrate boosting pass transistor 374 is also formed as a vertical transistor as are the memory cell pass transistors, however, the equilibration pass transistor is formed as a long transistor to maintain similar processing steps as are performed during the manufacturing of the memory sub-array. The equilibrate boosting pass transistor 374 couples the digit line DL2 162 to digit line DL3 164 when the equilibration signal 370 is asserted. The equilibrate boosting pass transistor 374 is formed between a vertical pillar 424 configured for coupling by way of a contact 426 (denoted by an "X") to an extended portion 390 to digit line DL2 162. The equilibrate boosting pass transistor 374 is further formed to include another vertical pillar 428 configured for coupling via a contact 430 (denoted by an "X") of the digit line DL3 164.

As stated, the equilibrate circuit 450 may be implemented using equilibrate circuit 182 rather tan relying on an equilibrate circuit in the sense amplifier. Accordingly, in another embodiment, an equilibrate circuit 450 may include the combination of equilibrate circuit 182, equilibrate boosting circuit 282, and equilibrate boosting circuit 382.

In a further embodiment of the present invention, a memory device is disclosed. The memory device includes a memory array configured in an open digit line architecture. The memory device further includes an equilibrate circuit including an equilibrate pass transistor configured to couple a terminated end of a first digit line to an equilibration reference and an equilibrate boosting circuit including a first equilibrate boosting pass transistor configured to couple an unterminated end of a second digit line to the terminated end of the first digit line, the first and second digit lines arranged directly adjacent to each other.

Figure 9:
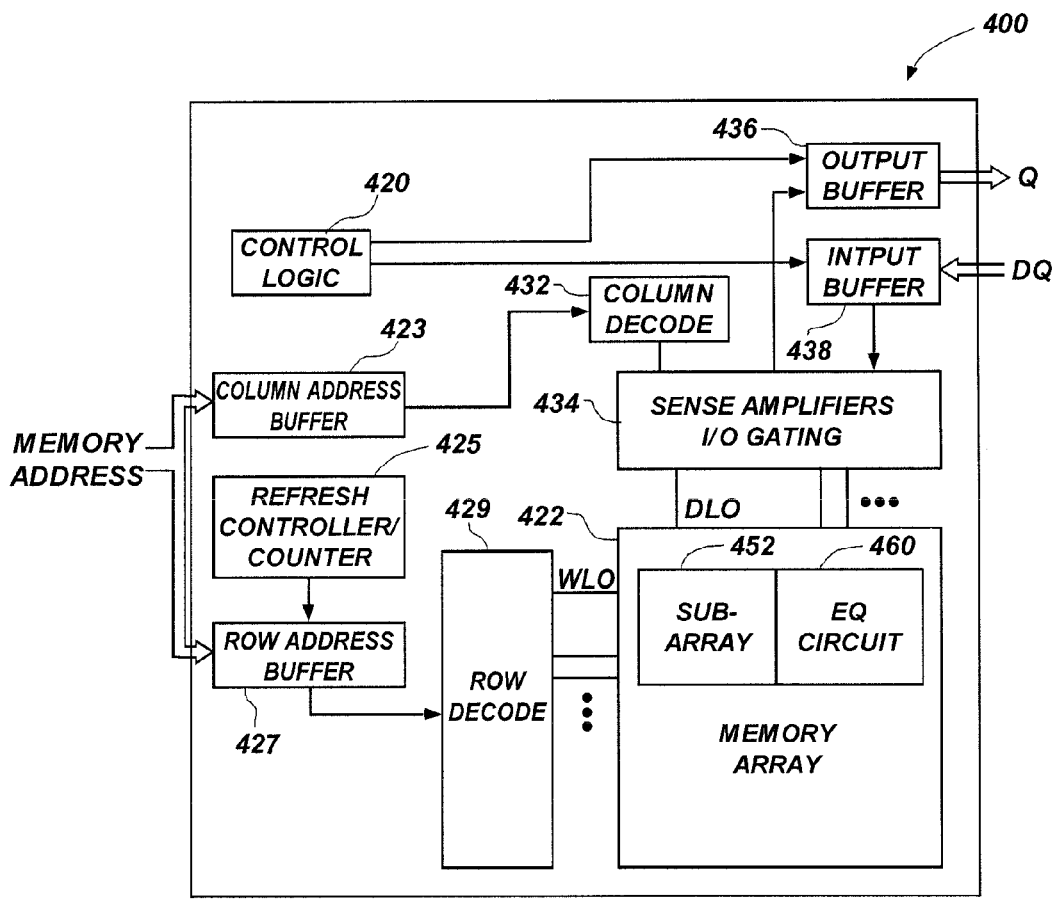
FIG. 9 is a block diagram of a memory device, in accordance with various embodiments of the present invention.

FIG. 9 is a block diagram of a memory device, in accordance with an embodiment of the present invention. A DRAM memory device 400 includes control logic circuit 420 to control read, write, erase and perform other memory operations. A column address buffer 423 and a row address buffer 427 are adapted to receive memory address requests. A refresh controller/counter 425 is coupled to the row address buffer 427 to control the refresh of the memory array 422. A row decode circuit 429 is coupled between the row address buffer 427 and the memory array 422. The memory array 422 includes a memory sub-array 452 and an equilibrate circuit 460, in accordance with the various embodiments of the present invention. A column decode circuit 432 is coupled to the column address buffer 423. Sense amplifiers-I/O gating circuit 434 is coupled between the column decode circuit 432 and the memory array 422. The DRAM memory device 400 is also illustrated as having an output buffer 436 and an input buffer 438. An external processor may be coupled to the control logic circuit 420 of the DRAM memory device 400 to provide external commands.

Another embodiment of the present invention discloses an electronic system. The electronic system includes a processor and a memory device operably coupled to the processor. The memory device includes a memory sub-array configured in an open digit line architecture and an equilibrate circuit. The equilibrate circuit includes an equilibrate pass transistor configured to couple a terminated end of a first digit line to an equilibration reference. The equilibrate circuit further includes an equilibrate boosting circuit including a first equilibrate boosting pass transistor configured to couple an unterminated end of a second digit line to the terminated end of the first digit line. Additionally, the first and second digit lines are arranged directly adjacent to each other.

Figure 10:
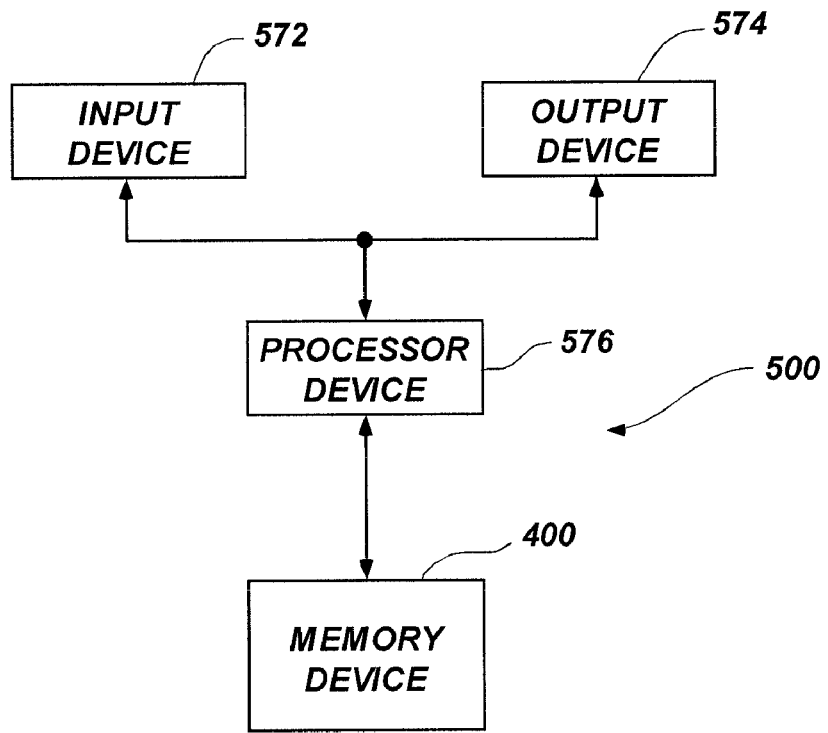
FIG. 10 is a block diagram of an electronic system, in accordance with various embodiments of the present invention.

FIG. 10 is a block diagram of an electronic system, in accordance with an embodiment of the present invention. The electronic system 500 includes an input device 572, an output device 574, and a memory device 400, all coupled to a processor device 576. The memory device 400 incorporates at least one memory sub-array and an equilibrate circuit according to one or more of the various embodiments disclosed herein.

A yet further embodiment discloses a semiconductor wafer including at least one memory array configured in an open digit line architecture. The memory array includes an equilibrate circuit configured to equilibrate a first digit line coupled to an equilibrate reference during an equilibrate process with an unterminated end of a second digit line.

Figure 11:
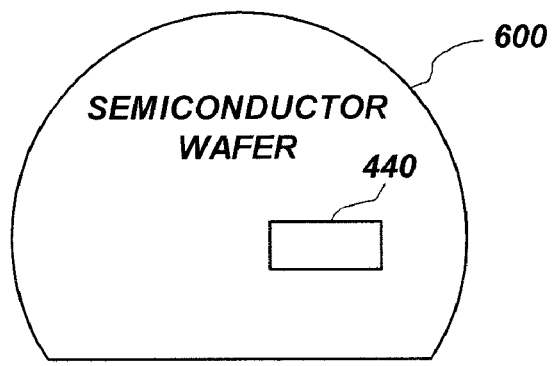
FIG. 11 is a diagram of a semiconductor wafer including an integrated circuit die incorporating one or more of the equilibrate circuits described herein, in accordance with various embodiments of the present invention.

FIG. 11 is a diagram of a semiconductor wafer including an integrated circuit die incorporating the memory array and capacitor-less memory cells of one or more of the previous embodiments, in accordance with a further embodiment of the present invention. As shown in FIG. 11, a semiconductor wafer 600 includes a yet-to-be-cut integrated circuit die 440 that incorporates one or more capacitor-less memory cells as herein disclosed.

The processes and devices described above illustrate embodiments of methods and devices out of many that may be used and produced according to the embodiments of the present invention. The above description and drawings illustrate embodiments which provide significant features and advantages of the present invention. It is not intended, however, that the present invention be strictly limited to the above-described and illustrated embodiments.

Although the present invention has been shown and described with reference to particular embodiments various additions, deletions and modifications that will be apparent to a person of ordinary skill in the art to which the invention pertains, even if not shown or specifically described herein, are deemed to lie within the scope of the invention as encompassed by the following claims.

What is claimed is:

1. A method of equilibrating digit lines in a memory device configured in an open digit line architecture, comprising:
   coupling a terminated end of a first digit line of a memory sub-array to an equilibration reference; and
   at least partially concurrently coupling an unterminated end of a second digit line of the memory sub-array to the terminated end of the first digit line.

2. The method of claim 1, wherein coupling an unterminated end further comprises coupling the unterminated end of the second digit line through a pass transistor configured at half a pitch of the open digit line architecture.

3. The method of claim 1, wherein coupling a terminated end of the first digit line further comprises coupling the terminated end of the first digit line through a pass transistor configured at half a pitch of the open digit line architecture to the equilibration reference.

4. The method of claim 1, wherein coupling of the first digit line to the equilibration reference and coupling the second digit line to the first digit line occur concurrently.

5. The method of claim 1, wherein coupling of the first digit line to the equilibration reference and coupling the second digit line to the first digit line occur for a different duration.

6. The method of claim 1, further comprising at least partially concurrently coupling the unterminated end of the second digit line with a terminated end of a third digit line directly adjacent to the second digit line.

7. A memory array, comprising:
   a memory sub-array configured in an open digit line architecture; and
   an equilibrate circuit formed according to the layout dimensions of the memory sub-array, the equilibrate circuit configured to equilibrate a plurality of digit lines at a pitch in the memory sub-array, the equilibrate circuit including pass transistors configured at less than the digit line pitch in the memory sub-array;
   wherein the equilibrate circuit further includes a first equilibrate boosting pass transistor configured to couple, in response to an equilibrate boosting signal, an unterminated end of the second digit line to a terminated end of the first digit line.

8. The memory array of claim 7, wherein the equilibrate circuit includes an equilibration pass transistor configured to couple, in response to an equilibrate signal, a first digit line at a terminated end with an equilibration reference.

9. The memory array of claim 8, wherein the equilibrate signal and the equilibrate boosting signal are concurrently assertable.

10. The memory array of claim 8, wherein the equilibrate boosting signal is assertable for a shorter duration than the equilibrate signal.

11. The memory array of claim 7, further comprising a second equilibrate boosting pass transistor configured to couple the unterminated end of the second digit line with a terminated end of a third digit line directly adjacent the second digit line.

12. The memory array of claim 7, wherein the unterminated end of the second digit line includes an extended portion for coupling the second digit line with the first equilibrate boosting pass transistor.

13. A memory device, comprising:
a memory array configured in an open digit line architecture; and
an equilibrate circuit including an equilibrate pass transistor configured to couple a terminated end of a first digit line of the memory array to an equilibration reference and an equilibrate boosting circuit including a first equilibrate boosting pass transistor configured to couple an unterminated end of a second digit line of the memory array to the terminated end of the first digit line, the first and second digit lines directly adjacent to each other.

14. The memory device of claim 13, wherein the equilibrate pass transistor is configured at half the pitch of the open digit line architecture.

15. The memory device of claim 13, wherein the first equilibrate boosting pass transistor is configured at half the pitch of the open digit line architecture.

16. The memory device of claim 13, wherein the equilibrate circuit further includes a second equilibrate boosting pass transistor configured to couple the unterminated end of the second digit line with a terminated end of a third digit line, the third digit line and the second digit line directly adjacent to each other.

17. The memory device of claim 13, wherein the equilibrate circuit is configured at the edge of the memory array and fabricated as an extension of the memory array.

18. The memory device of claim 13, wherein the first equilibrate boosting pass transistor is formed at twice a feature size of a pass transistor in a memory cell of the memory array.

19. The memory device of claim 13, wherein the equilibrate pass transistor and the first equilibrate boosting pass transistor are configured for concurrent activation.

20. The memory device of claim 13, wherein the first equilibrate boosting pass transistor is configured for activation for a portion of the duration of the activation of the equilibrate pass transistor.

21. An electronic system, comprising:
a processor; and
a memory device operably coupled to the processor, the memory device including a memory sub-array configured in an open digit line architecture and an equilibrate circuit including an equilibrate pass transistor configured to couple a terminated end of a first digit line of the memory sub-array to an equilibration reference and an equilibrate boosting circuit including a first equilibrate boosting pass transistor configured to couple an unterminated end of a second digit line of the memory sub-array to the terminated end of the first digit line, the first and second digit lines directly adjacent to each other.

22. The electronic system of claim 21, wherein the first equilibrate boosting pass transistor is configured as an extension of the memory sub-array and formed at a multiple of a feature size of a pass gate of a memory cell of the memory sub-array.

23. The electronic system of claim 21, further comprising a second equilibrate boosting pass transistor configured to couple the unterminated end of the second digit line with a terminated end of a third digit line directly adjacent to the second digit line.

24. A semiconductor wafer including at least one memory array configured in an open digit line architecture, the at least one memory array including an equilibrate circuit configured to equilibrate a first digit line of the at least one memory array coupled to an equilibrate reference during an equilibrate process with an unterminated end of a second digit line of the at least one memory array.

25. The semiconductor wafer of claim 24, wherein the equilibrate circuit is further configured to couple together each digit line of the at least one memory array during the equilibrate process.

26. A method of equilibrating a digit line in a memory device configured in an open digit line architecture, comprising:
equilibrating the digit line from a terminated end with an unterminated end of another digit line; and
substantially concurrently equilibrating the digit line from an unterminated end.

* * * * *